United States Patent [19]
Motomura

[11] Patent Number: 5,862,396
[45] Date of Patent: Jan. 19, 1999

[54] MEMORY LSI WITH ARITHMETIC LOGIC PROCESSING CAPABILITY, MAIN MEMORY SYSTEM USING THE SAME, AND METHOD OF CONTROLLING MAIN MEMORY SYSTEM

[75] Inventor: Masato Motomura, Tokyo, Japan

[73] Assignee: NEC Corporation, Tokyo, Japan

[21] Appl. No.: 897,430

[22] Filed: Jul. 21, 1997

[30] Foreign Application Priority Data

Aug. 2, 1996 [JP] Japan ..................................... 8-204668

[51] Int. Cl.$^6$ ............................. G06F 11/16; G06F 13/16
[52] U.S. Cl. ................................ 395/800.14; 395/800.36; 395/894; 395/182.01
[58] Field of Search ............................... 395/309, 800.34, 395/200.33, 800.14, 894, 800.36, 800.37, 182.01; 365/230.03, 230.02, 189.07, 233, 189.01, 109.01; 345/524, 510; 711/106, 118; 364/710.14

[56] References Cited

U.S. PATENT DOCUMENTS

| | | | |
|---|---|---|---|
| 4,138,734 | 2/1979 | Nakata et al. | 364/710.14 |
| 5,345,555 | 9/1994 | Providenza et al. | 345/524 |
| 5,444,665 | 8/1995 | Yamaguchi et al. | 365/230.02 |
| 5,726,947 | 3/1998 | Yamazaki et al. | 365/230.03 |

FOREIGN PATENT DOCUMENTS

| | | |
|---|---|---|
| 189524 | 10/1985 | European Pat. Off. . |
| 2225657 | 6/1990 | United Kingdom . |
| 2252185 | 7/1992 | United Kingdom . |

OTHER PUBLICATIONS

"Computer Architecture A Quantitative Approach", Second Edition, by D.A. Patterson and J.L. Hennessy, published by Morgan Kaufmann Publishers, Inc., Chapter 1, pp. 38–45.

"Design of Microprocessor–Based Systems", by Nikitas Alexandridis, published by Prentice Hall, Chapter 1, pp. 6–15.

T. Shimizu et al., "FP 13.4: A Multimedia 32b RISC Microprocessor with 16Mb DRAM", *1996 IEEE International Solid–State Circuits Conference*, pp. 216–217.

Aimoto et al., "SP 23.3: A 7.68GIPS 3.84GB/s 1W Parallel Image–Processing RAM Integrating a 16Mb DRAM & 128 Processors", *1996 IEEE International Solid–State Circuits Conference*, pp. 372–373.

"MMX™ Technology Technical Overview", published by Intel Corporation, Jun. 24, 1997, pp. 1–13.

"16/18Mbit (2M×8/9) & 64/72Mbit (8M×8/9) Concurrent RDRAM", published by Rombus Inc., Jul. 1996, pp. 1–36.

*Primary Examiner*—Daniel H. Pan
*Attorney, Agent, or Firm*—Sughrue, Mion, Zinn, Macpeak & Seas, PLLC

[57] ABSTRACT

In a main memory with arithmetic logic processing capability, k first memories (k is an integer equal to or more than 0) are connected to a memory bus, for storing data. M second memories with arithmetic logic processing capability (m is an integer equal to or more than 1) are also connected to the memory bus. Each of the m second memories includes a memory section for storing data, and an arithmetic logic processing section. The arithmetic logic processing section performs a first processing to at least a part of the data stored in the memory section in response to a first instruction inputted via the memory bus, and allows a result of the first processing to be outputted onto the memory bus in response to a second instruction inputted via the memory bus. The arithmetic logic processing section may further includes a macro code RAM for storing macro codes. The main memory with arithmetic logic processing capability and a memory device with arithmetic logic processing capability used in the same have compatibility with a corresponding main memory and a corresponding memory device.

33 Claims, 12 Drawing Sheets

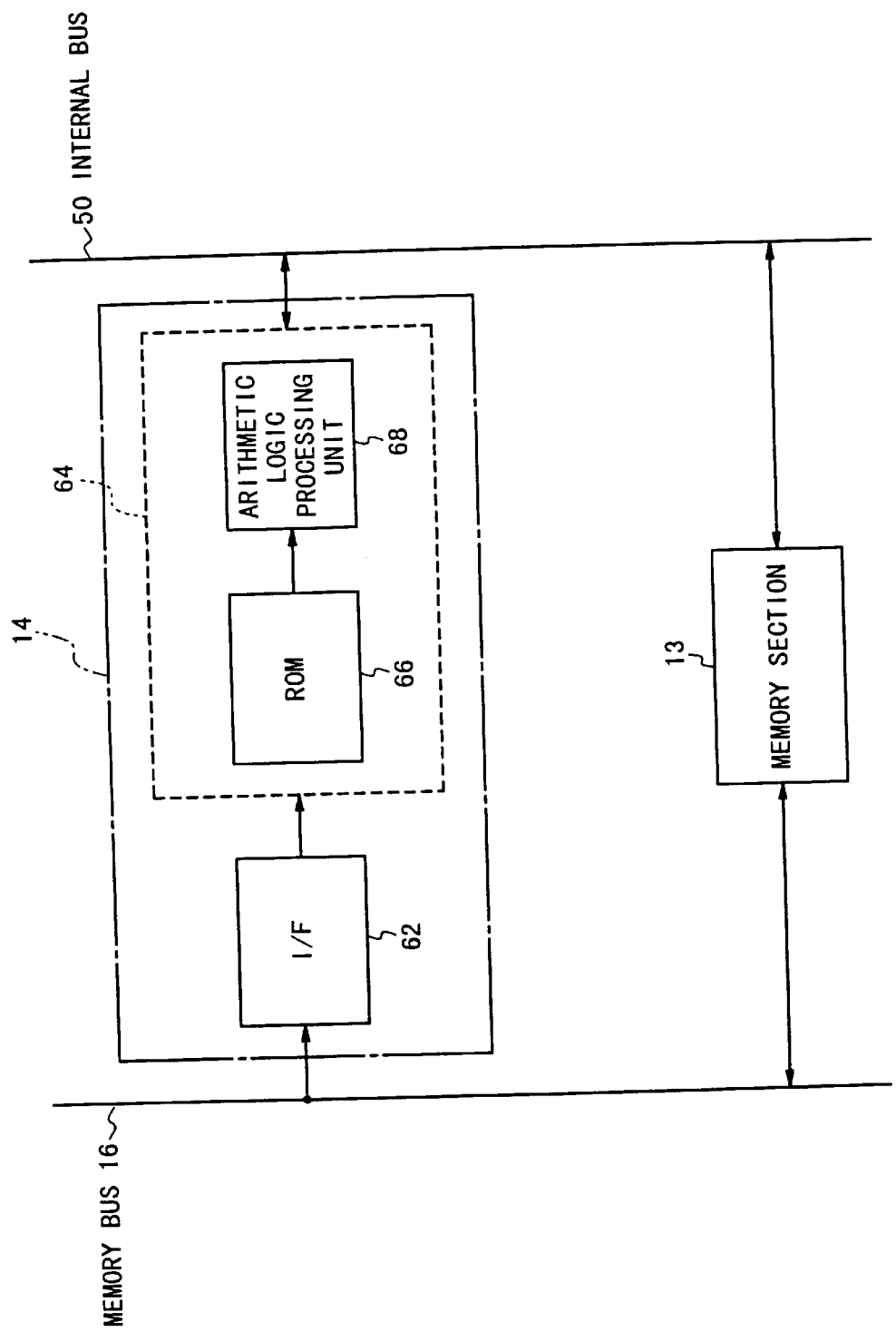

MEMORY LSI WITH ARITHMETIC LOGIC PROCESSING CAPABILITY, MAIN MEMORY SYSTEM USING THE SAME, AND METHOD OF CONTROLLING MAIN MEMORY SYSTEM

BACKGROUND OF THE INVENTION

1. Field of the Invention

The present invention relates to a memory LSI with arithmetic logic processing capability which is used in a processor system, and a main memory system using the same, and a method of controlling this main memory system.

2. Description of the Related Art

A computer or computer system such as a personal computer and a work station is generally called a processor system. Such a conventional processor system is described in detail in, for example, "Computer Architecture: A Quantitative Approach", by John L. Hennessy and David A. Patterson, (published from Morgan Kaufmann Publishers Inc.) and "Design of Microprocessor-Based Systems", by Nikitas Alexandridis, (published from the Prentice Hall), and so on.

FIG. 1 shows the general structure of the conventional processor system. Referring to FIG. 1, a processor system is composed of a processor 31 including a primary cache memory 35, a system controller 32, a secondary cache memory 34, a main memory system 9, an I/O subsystem 33.

The processor 31 is usually realized as a microprocessor which is integrated on an LSI. The system controller 32 controls the main memory system 9, the secondary cache memory 34 in response to a main memory access and the I/O subsystem 33 in response to an I/O access from the processor 31. Also, the system controller 32 transfers an interrupt request from the I/O subsystem 33 to the processor 31.

The processor 31 and the system controller 32 are connected by a control signal line 36-1, an address signal line 36-2, and a data signal line 36-3. Also, the system controller 32 and the main memory system 9 are connected by a memory bus 16. In the field of personal computer, the system controller 32 is realized by a plurality of different LSIs. Accordingly, it is generally called a chip set or a peripheral chip set.

FIG. 2 shows a first example of the structure of the conventional main memory system 9. The main memory system 9 is the system which stores an input data used to perform arithmetic logic processing by the processor system, a data during the arithmetic logic processing, an output data of the arithmetic logic processing, a program used to perform the arithmetic logic processing, and so on. A main memory space read/write operation to a memory data in the main memory system 9 is executed by issuing a load/store instruction from the processor 31.

Referring to FIG. 2, the main memory system 9 is composed of plurality of DRAM LSIs 11 and each of the DRAM LSIs 11 contains a memory section 13 which is composed of a DRAM cell array, a sense amplifier, a decoder, and so on. The respective DRAM LSIs 11 are connected to a memory bus 16 composed of a control signal line 16-1, an address signal line 16-2, and a data signal line 16-3. As shown in FIG. 1, the memory bus 16 is used for connection between the main memory system 9 and the system controller 32. The data signal line 16-3 is a bi-directional signal line because it used for both of a read data and a write data.

Also, in order to widen a data band width of the main memory system 9, i.e., a bus band width of the memory bus 16, the data signal line 16-3 has the bit width which is wider than the number of data input/output terminals of each DRAM LSI 11. Accordingly, the structure is generally constructed such that a part of the data signal line 16-3 is connected to each DRAM LSI 11. For example, a structure is often adopted in which eight DRAM LSIs 11 each having the data input/output terminals of 16 bits are used to be connected to the data signal line 16-3 which has a 128-bit band width. As the DRAM LSI 11 which is used in the structure of such a main memory system 9, there is known, for example, a fast page mode DRAM, an extended data out (EDO) DRAM, a synchronous DRAM, and so on.

FIG. 3 shows a second example of the structure of the conventional main memory system 9. Referring to FIG. 3, a memory bus 16 is connected to a memory bus 16 composed of a control signal line 16-1 and a bi-directional data/address signal line 16-4. In this case, the data/address signal line 16-4 is provided to have the same bit width as the bit width of the data/address input/output terminals of each DRAM LSI 11, different from the data signal line 16-3 in the structure example shown in FIG. 2.

Such a structure is devised to solve a problem that a lot of DRAM LSIs 11 must be used for the main memory system 9 in order to widen the memory bus band width in the structure of the main memory system 9 shown in FIG. 2. As the DRAM LSI 11 used in the structure of such a main memory system 9, there are known, for example, a Rambus DRAM and so on.

The structure of the main memory system 9 is aimed at reducing the number of signal lines which constitutes the memory bus 16 and the number of input/output terminals of the DRAM LSI 11. At the same time, the structure is aimed at increasing a bus band width by driving the signal line at high speed. In this case, because the problems such as noise generation due to high-speed drive and distribution of delay times on the signal lines can be reduced by decreasing the number of signal lines, such high-speed drive is made possible.

In the structure of the main memory system 9 shown in FIG. 2, a memory bus band width is provided by arranging the DRAM LSIs 11 in parallel. Accordingly, there is a problem in that a lot of DRAM LSIs 11 must be used for the main memory system 9 to widen the memory bus band width. On the other hand, in the structure of the main memory system 9 shown in FIG. 3, because the memory bus band width is provided by driving the memory bus 16 at high speed, such a problem does not occur. As the DRAM LSI 11 used in the structure of the main memory system 9 shown in FIG. 3, there are known, for example, a Rambus DRAM and so on.

In the Rambus DRAM, specific technique is developed about structuring method and driving method of the memory bus 16 in order to realize the high-speed drive of the memory bus 16. However, because they are not in relation with the present invention, the description is omitted here. Note that the Rambus DRAM is described in detail in Rambus technology guide published from Rambus in USA.

On the other hand, the method is proposed of producing an LSI in which a memory, especially, a DRAM and an arithmetic logic processing circuit are merged on an LSI chip so that a type of arithmetic logic processing can be executed using the memory or DRAM in the chip. Such technique is generally called merged logic-DRAM technique. A typical example of the conventional technique of the merged logic-DRAM technique is described in "A Multimedia 32b RISC Microprocessor with 16 Mb DRAM", by Toru Shimizu et al., (1996 IEEE International Solid-State Circuits Conference, pp. 216 to 217), or "A 7.68 GIPS, 3.84 GB/s, 1 W, Parallel Image-Processing RAM Integrating a 16 Mb DRAM and 128 Processors", by Yoshiharu Aimoto et al. (1996 IEEE International Solid-State Circuits Conference, pp. 372 to 373). These are called merged logic-DRAM conventional technique 1 and merged logic-DRAM conventional technique 2 in the following description, respectively.

In the merged logic-DRAM conventional technique 1, a processor and a part of the main memory system is installed in one LSI chip. The LSI occupies a position of the processor 31 in the processor system shown in FIG. 1. The LSI has an advantage that it does not need any main memory system 9 to be installed outside it at all, when the main memory capacity is sufficient only with the DRAM in the chip.

On the other hand, in the merged logic-DRAM conventional technique 2, parallel processors dedicated to image processing and a DRAM for supplying the parallel processors with an image data are installed into one LSI chip. The LSI occupies a position of the I/O subsystem 33 in the processor system shown in FIG. 1, and it has a function to perform only the image processing at high speed in the I/O subsystem 33.

However, in the conventional technique on the main memory system as described above, there is a problem in that the provision of a necessary memory bus band width is difficult. When it is not possible to provide a sufficient memory bus band width, the effective performance of the processor system is limited by the insufficient memory bus band width, even if the processor has high performance. Also, there is another problem in that the conventional technique on the merged logic-DRAM technique as described above is not an effective solution to the problem on the provision of the memory bus band width of the main memory system. Hereinafter, these problems will be described.

Generally, it is known that the processing capability of the processor 31 is proportional to the data band width of the memory bus 16 of the main memory system 9, that is, the memory bus band width which is required to fully draw out the processing capability. This is because the number of times of access to the main memory system required in the processing of whole of an arbitrary program is determined. If the processing should be executed at higher speed, it is necessary to execute the access to the main memory more times per a unit time. As the semiconductor technology develops, the processing capability of the processor 31 continues improvement in a geometric series manner. However, it is very difficult to provide the memory bus band width so as to correspond to such performance improvement in processing capability.

One of the reasons is that the memory bus 16 is wirings for connecting between the plurality of LSIs on a print circuit board. Therefore, a load capacitor per a wire operation is large so that it is difficult to perform the high-speed operation compared to an internal wiring of the LSI. Also, another reason is that an internal circuit of the LSI is connected through external I/O terminals of the LSI to the memory bus 16 which is wirings on the print circuit board. Therefore, the number of signal lines of the memory bus is limited, compared to the internal wirings of the LSI. In this way, it is a very difficult problem to provide a necessary memory bus band width from the viewpoint of the operation speed of the signal lines of the memory bus 16 and from the viewpoint of the number of the signal lines.

Generally, in case of attempting to increase the data transfer band width between two circuit blocks, the most effective method is to install or merge these circuit blocks on one LSI chip. This is because, inside the LSI, it is possible to expect substantial improvement in both of the operation speed of the signal lines and the number of signal lines, compared to the wiring on the print circuit board. In accordance with, the merged logic-DRAM technique has a possibility to provide a solution in the point of the provision of the memory bus band width of the main memory system 9 as described above. However, because the conventional merged logic-DRAM technique is applied to the inside of the processor 31 or the I/O subsystem 33, it is not a satisfactory solution in the point of the improvement of the memory bus band width of the main memory system 9. This is based on the following reason.

The above-mentioned merged logic-DRAM conventional technique 1 is an effective solution in point of the provision of a memory bus band width, if the capacity of a DRAM merged with the processor 31 is larger than the capacity originally required for the processor 31 or an application program which runs on the processor 31.

However, it is extremely important that the main memory system 9 has extension possibility of the memory capacity. The necessary memory capacity is often larger than the memory capacity of a DRAM which can be merged in the LSI chip. The reason why the extension possibility is necessary is that it is important from the viewpoint of cost that the main memory systems 9 having various memory capacities can be supported because the necessary memory capacity depends on a kind of application. Also, the necessary memory capacity of the main memory system 9 is, for example, from about 16 megabytes to about 256 megabytes. It is larger than the memory capacity of a DRAM which can be merged in the LSI chip. For this reason, it is very difficult to provide the necessary memory bus band width between the processor 31 and an external main memory system 9, when the external main memory system 9 must be connected to the processor 31 which is based on the merged logic-DRAM conventional technique 1.

On the other hand, the merged logic-DRAM conventional technique 2 is the technique which can utilize a high band width data transfer only when specific processing is performed in the I/O subsystem 33. However, the merged logic-DRAM conventional technique 2 is not possible to become a solution in point of provision of the memory bus band width of the main memory system 9. If the specific processing is executed in The I/O subsystem 33 instead of the processor 31, it is possible to reduce the load of the processor 31 and the memory bus band width which is required with the load as the secondary effect. However, there is also a problem in that the superior performance of the processor 31 continuously developed can not be fully utilized.

This is because such a method only means transfer of the processing to be performed by the processor 31 to the I/O subsystem 33. Also, there is a problem in the point of the extendibility of the memory capacity, like the above-mentioned conventional technique 1. This is because a high band width data transfer is not possible, when a memory other than the DRAM within the I/O subsystem 33 which is provided based on the merged logic-DRAM conventional technique 2 is accessed.

SUMMARY OF THE INVENTION

The present invention is made in the light of the above-mentioned circumstances. An object of the present invention is to provide a memory device with arithmetic logic processing capability and a main memory system using the same, in which the above problems can be solved that it is difficult to provide a memory bus band width of a main memory system which corresponds to a processor having high performance.

Another object of the present invention is to provide a method of controlling the main memory system.

Still another object of the present invention is to provide the above main memory system with arithmetic logic processing which can be used without any problem in place of a main memory system of the conventional technique.

In order to achieve an aspect of the present invention, a main memory with arithmetic logic processing capability, includes a memory bus, k first memories (k is an integer equal to or more than 0) connected to the memory bus, for storing data, and m second memories with arithmetic logic processing capability (m is an integer equal to or more than 1) connected to the memory bus. Each of the m second memories includes a memory section for storing data, and an arithmetic logic processing section for performing a first processing to at least a part of the data stored in the memory section in response to a first instruction inputted via the memory bus, and for allowing a result of the first processing to be outputted onto the memory bus in response to a second instruction inputted via the memory bus. The arithmetic logic processing section stores the first processing result in the memory section and allows a data designating the first processing result to be outputted onto the memory bus in response to the second instruction inputted via the memory bus.

Each of the m second memories has a same terminal structure in an electrical and physical manner as each of the k first memories.

The first instruction may be a write instruction to a specific one of the m second memories, and the second instruction may be a read instruction to the specific second memory. Alternatively, the first instruction may be a coprocessor start operation to a specific one of the m second memories, and the second instruction may be a coprocessor synchronize operation to the specific second memory.

When the arithmetic logic processing section includes an interface circuit composed of at least a pair of registers, an address space of the main memory is composed of a first address space for each of the k first memories, a second address space for the memory section of each of the m second memories, and a third address space for the interface section of the arithmetic logic processing section of each of the m second memories. In this case, the first instruction is a write instruction to one of the registers of the pair, and the second instruction is a read instruction to the other of the registers of the pair. Also, the third address space is designated as an un-chacheable space on an operating system. In addition, the arithmetic logic processing section includes an interface circuit composed of at least a pair of registers, and which of a part of a first address space for each of the k first memories, and an address space of a second address space for the memory section of each of the m second memories and a third address space for the interface section is to be used is selected on an operating system.

The main memory is desirably installed on a print circuit board which can be installed in a processor system including another main memory board, in place of the other main memory board.

In order to achieve another aspect of the present invention, a main memory with arithmetic logic processing capability, includes a memory bus, k first memories (k is an integer equal to or more than 0) connected to the memory bus, for storing data, and m second memories with arithmetic logic processing capability (m is an integer equal to or more than 1) connected to the memory bus. Each of the m second memories includes a memory section for storing data, a storing section for storing at least a macro code, and an arithmetic logic processing section for executing the at least a macro code in response to a first instruction inputted via the memory bus to perform a first processing to at least a part of the data stored in the memory section, and for allowing a result of the first processing to be outputted onto the memory bus in response to a second instruction inputted via the memory bus.

In order to achieve still another aspect of the present invention, a memory device with arithmetic logic processing capability, includes a memory bus connected to external terminals, an internal bus, a dynamic random access memory (DRAM) section connected between the memory bus and the internal bus, and an arithmetic logic processing section connected between the memory bus and the internal bus, for performing a first processing to at least a part of data stored in the DRAM section in response to a first instruction inputted via the memory bus, and for allowing a result of the first processing to be outputted onto the memory bus in response to a second instruction inputted via the memory bus.

In order to achieve yet still another aspect of the present invention, a method of controlling a main memory with arithmetic logic processing capability in a processor system including a processor, the main memory comprising at least one memory device with arithmetic logic processing capability, includes the steps of:

issuing a first instruction from the processor to the memory device via a memory bus;

performing a processing to at least a part of data stored in the memory section in the memory device in response to the first instruction;

storing a processing result in the memory device;

issuing a second instruction from the processor to the memory device via the memory bus; and outputting a data designating the processing result to the processor in response to the second instruction inputted via the memory bus.

BRIEF DESCRIPTION OF THE DRAWINGS

FIG. 8 is a block diagram illustrating the structure of a memory LSI with arithmetic logic processing capability according to a first embodiment of the present invention;

DESCRIPTION OF THE PREFERRED EMBODIMENTS

A processor system using a main memory system composed of memory devices with arithmetic logic processing capability of the present invention will be described below in detail with reference to the accompanying drawings.

Figure 4:
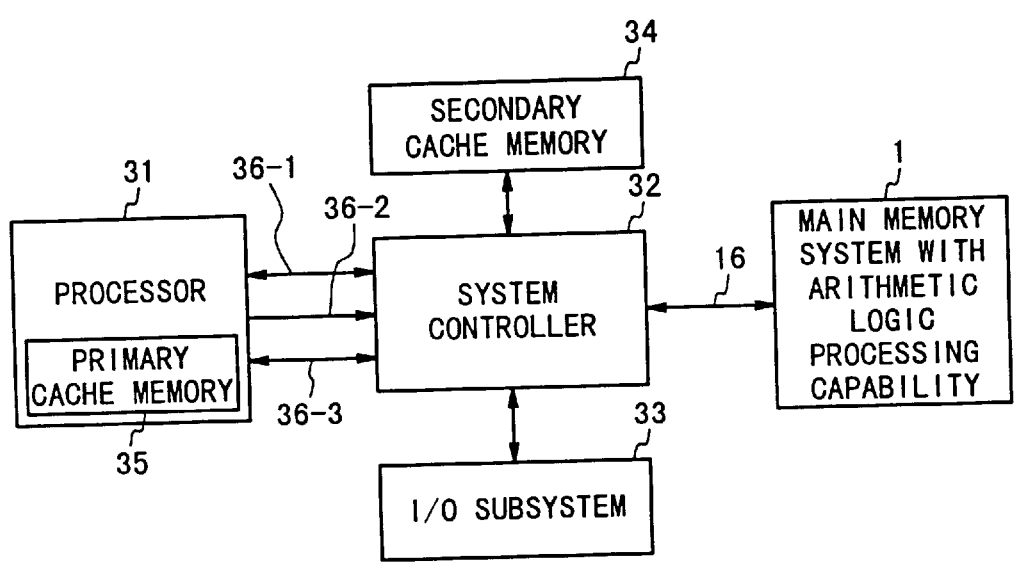
FIG. 4 is a block diagram illustrating the structure of a processor system using a main memory system with arithmetic logic processing capability according to an embodiment of the present invention.

FIG. 4 is a block diagram illustrating the structure of an embodiment of the processor system which uses the main memory system 1 with arithmetic logic processing capability of the present invention. Referring to FIG. 4, the processor system 3 of the present invention is composed of a processor 31, a system controller 32, a secondary cache memory 34, a main memory system 1 with arithmetic logic processing capability, and an I/O subsystem 33.

The processor 31 is ordinarily realized as a microprocessor which is integrated on one LSI chip. Also, the processor 31 includes a primary cache memory 35 therein.

The system controller 32 has a function to control the main memory system 1 with arithmetic logic processing capability, the secondary cache memory 34, or the I/O subsystem 33 in response to a main memory access or I/O access from the processor 31. Also, the system controller 32 has a function to transfer an interrupt request from the I/O subsystem 33 to the processor 31. Further, the system controller 32 transfers an arithmetic logic processing start request and an arithmetic logic processing result request from the processor 31 to the main memory system 1, an arithmetic logic processing result reply from the main memory system 1 to the processor 31. The processor 31 and the system controller 32 are connected by a control signal line 36-1, an address signal line 36-2 and a data signal line 36-3. Also, the system controller 32 and the main memory system 1 are connected to a memory bus 16.

Figure 5:
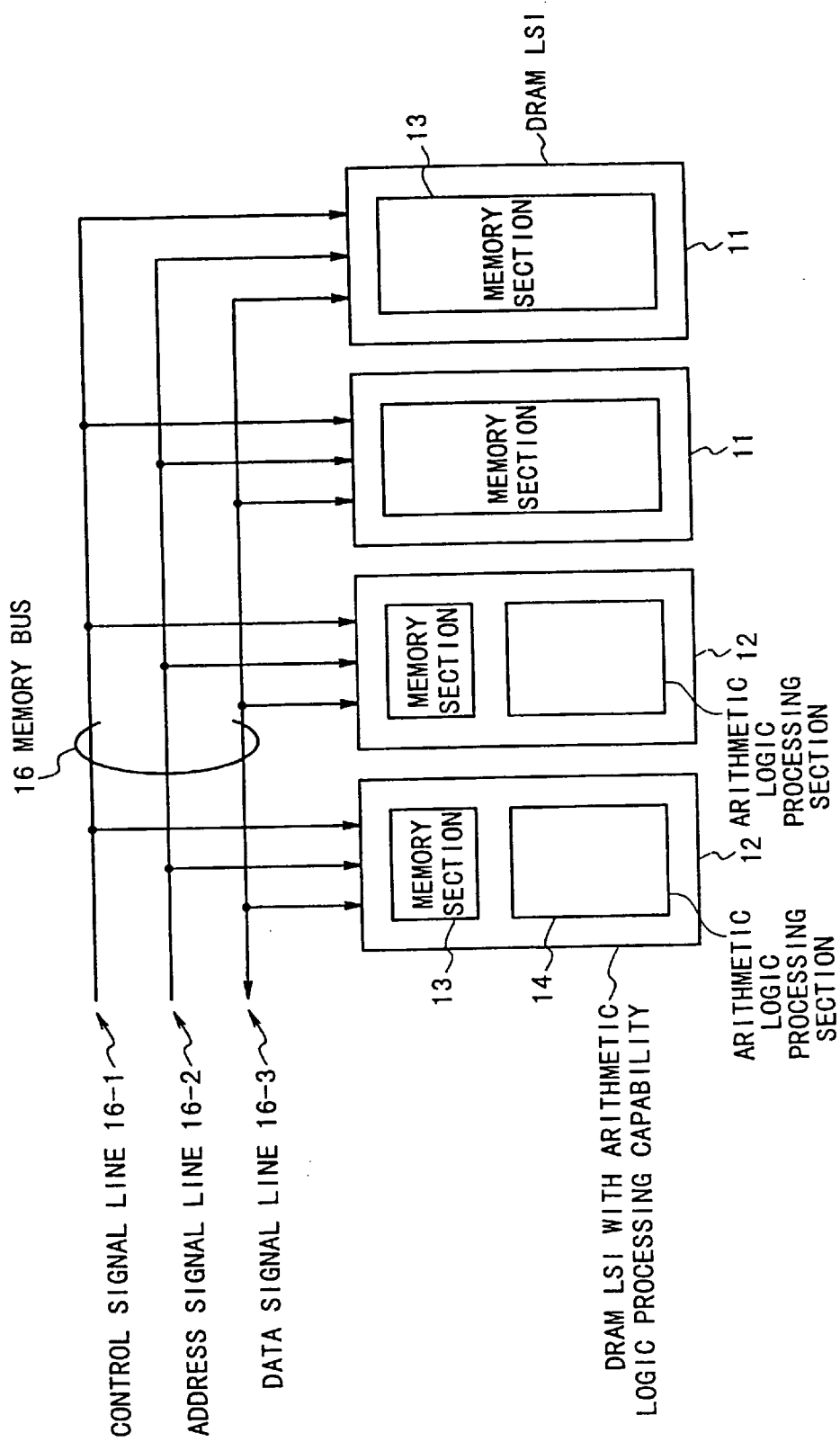
FIG. 5 is a block diagram illustrating the structure of a main memory system with arithmetic logic processing capability according to the first embodiment of the present invention in the processor system shown in FIG. 4.

FIG. 5 is a block diagram illustrating the structure of the main memory system 1 with arithmetic logic processing capability according to the first embodiment of the present invention. Referring to FIG. 5, the main memory system 1 with arithmetic logic processing capability is composed of the memory bus 16, an arbitrary number of DRAM LSIs 11 connected to the memory bus 16, and an arbitrary number of DRAM LSIs 12 with arithmetic logic processing capability connected to the memory bus 16.

Figure 2:
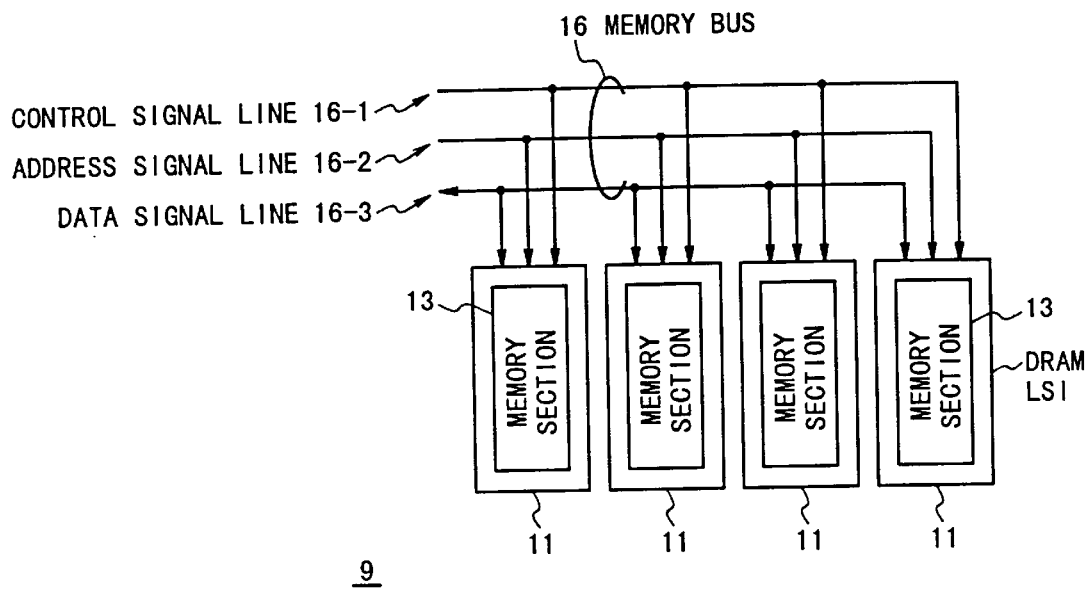
FIG. 2 is a block diagram illustrating the structure of a first conventional example of the main memory system shown in FIG. 1.

The DRAM LSI 11 is composed only of a memory section 13. On the other hand, the DRAM LSI 12 with arithmetic logic processing capability is composed of a memory section 13 and an arithmetic logic processing section 14. Specific processing is allocated to the arithmetic logic processing capability section 14 of each of the DRAM LSIs 12. The specific processing may be same between two or more DRAM LSIs 12 or may be different between two or more DRAM LSIs 12 from each other. The memory bus 16 is composed of a control signal line 16-1, an address signal line 16-2, and a data signal line 16-3. Like the main memory system 9 shown in FIG. 2 as the first example of the conventional technique, only the data signal line 16-3 is the bi-directional signal line.

A typical example of the processing which is performed by the arithmetic logic processing section 14 of the DRAM LSI 12 with arithmetic logic processing capability is processing to an image. For example, in an application program by which a moving picture is expanded, discrete cosine transform (DCT) processing, reverse DCT processing, processing for difference between image frames, filtering processing and so on may be performed on the different DRAM LSIs 12, respectively. Alternatively, for example, the expand processing of the moving picture for a screen may be performed by two DRAM LSI2 12. In this case, the expand processing for an upper part of the screen is performed by one of the DRAM LSIs 12 and the expand processing for a lower part of the screen is performed by the other of the DRAM LSIs 12. Also, similarly, in an application program by which a moving picture is compressed, processing for searching a motion vector and so on are executed in addition to above these processing. The processor 31 controls the whole of these application programs, and requests the execution of the processing for treating the above-mentioned moving picture data directly to the DRAM LSI 12 with arithmetic logic processing capability and receives a processing result.

In order to perform such processing, the arithmetic logic processing section 14 needs to include the hardware such as an adder, a multiplier and so on. Typically, it could be considered that a digital signal processor (DSP), a multimedia processing unit which is installed into a microprocessor in recent years and so on are installed as the arithmetic logic processing section 14. The multimedia processing unit is described in detail in, for example, the specification of a multimedia extension (MMX) available from Intel in USA.

Figure 3:
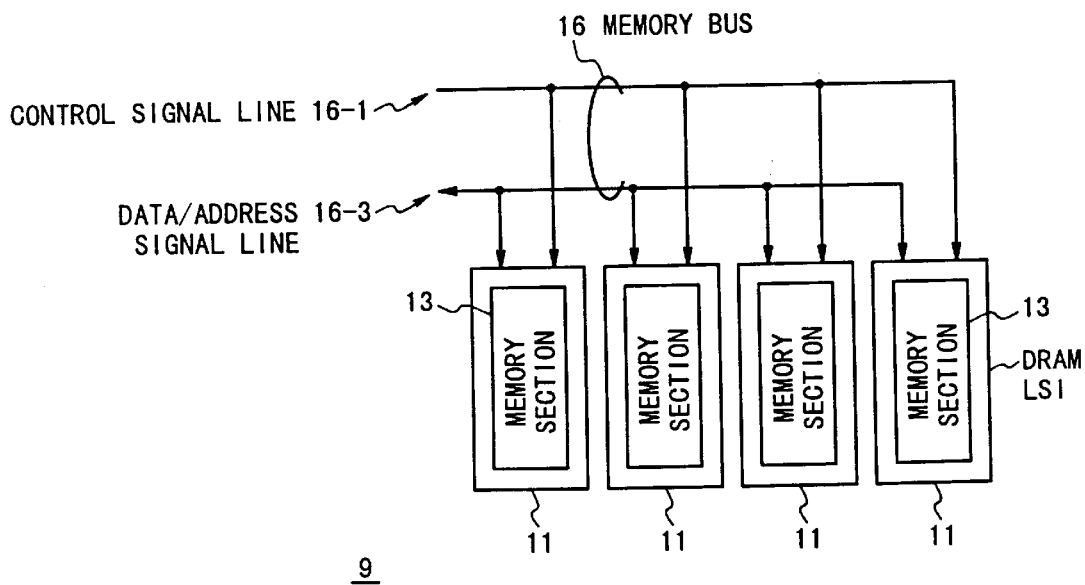
FIG. 3 is a block diagram illustrating the structure of a second conventional example of the main memory system shown in FIG. 1.
Figure 6:
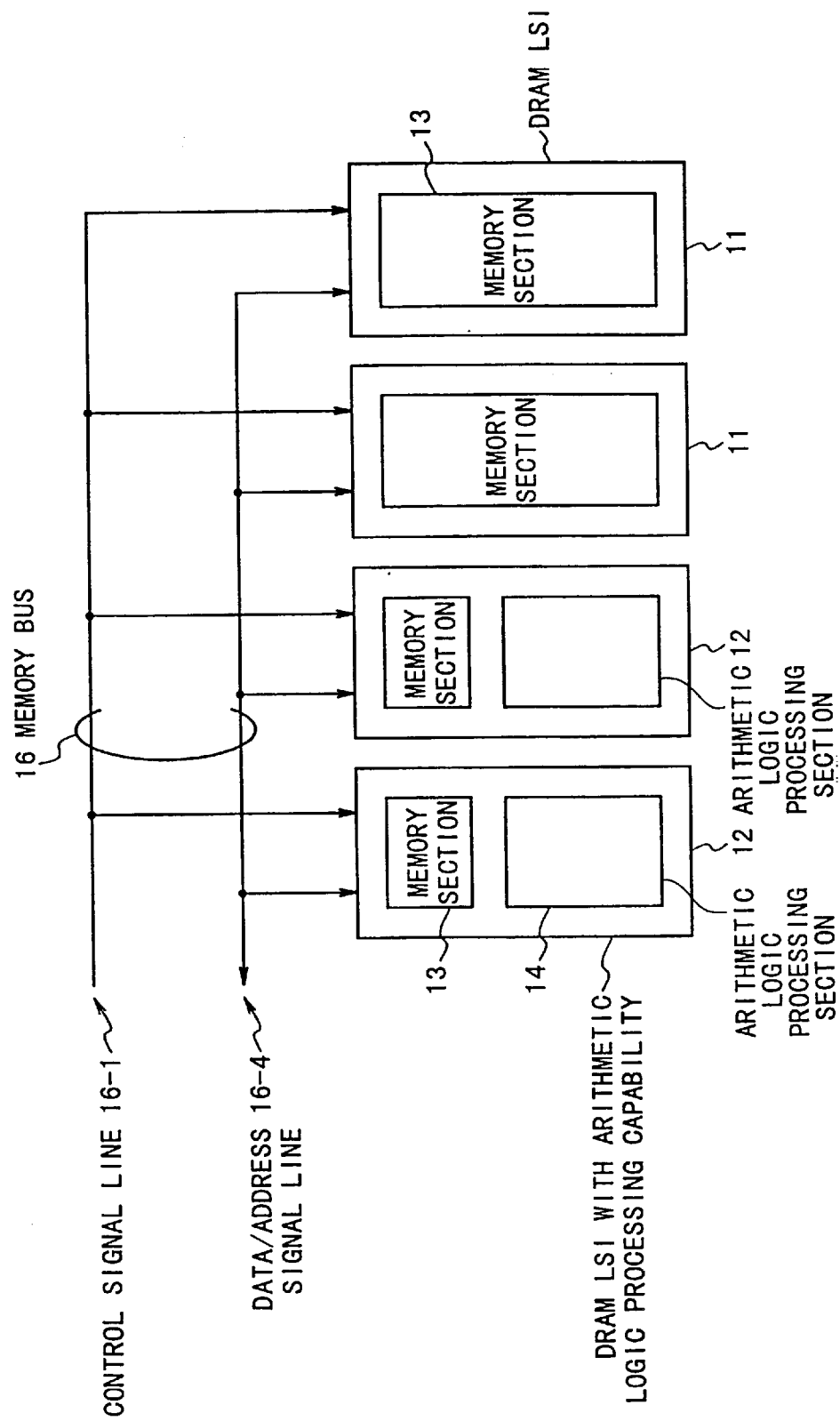
FIG. 6 is a block diagram illustrating the structure of the main memory system with arithmetic logic processing capability according to the second embodiment of the present invention in the processor system shown in FIG. 4.

FIG. 6 is a block diagram illustrating the structure of the main memory system with arithmetic logic processing capability according to the second embodiment of the present invention. Referring to FIG. 6, the main memory system 1 with arithmetic logic processing is composed of an arbitrary number of DRAM LSIs 11 and an arbitrary number of DRAM LSIs 12 with arithmetic logic processing capability. The DRAM LSI 11 is composed only of a memory section 13. On the other hand, the DRAM LSI 12 with arithmetic logic processing capability is composed of a memory section 13 and an arithmetic logic processing section 14. The DRAM LSIs 11 and the DRAM LSIs 12 with arithmetic logic processing capability is connected to a memory bus 16 in the main memory system 1 with arithmetic logic processing capability. The memory bus 16 is connected to a control signal line 16-1, and a data/address signal line 16-4. Like the main memory system 9 shown in FIG. 3 as the second example of the conventional technique, the data/address signal line 16-4 is the bi-directional signal line.

As seen from FIGS. 5 and 6, the DRAM LSI 12 with arithmetic logic processing capability and the DRAM LSI 11 are connected to the memory bus 16. That is, the DRAM LSI 12 with arithmetic logic processing capability of the present invention has the same structure of input/output signal terminals as that of the DRAM LSI 11. Or, in the DRAM LSI 12, the input/output signal terminals can be connected at least to the same memory bus 16 just as they are. In this case, the same structure of input/output signal terminals means that the DRAM LSI 12 has physically and electrically the same structure as the DRAM LSI 11. That is, the number of input/output terminals, the terminal positions of them are same, and the electrical signal interface is same between the DRAM LSI 12 and the DRAM LSI 11. The electrical signal interface means, for example, either an input terminal or output terminal, or the potential level of a signal to the terminal, and the timing that the signal can be effectively inputted or outputted.

Also, that the input/output signal terminals can be connected to the same memory bus 16 just as they means that at least a part of the input/output terminals of the DRAM LSI 12 with arithmetic logic processing capability is the same as the input/output signal terminals of the DRAM LSI 11. In this case, the DRAM LSI 12 with arithmetic logic processing capability which is constituted by adding the arithmetic logic processing section 14 to the DRAM LSI 11 can be connected to the same memory bus 16 to which the DRAM LSI 11 having an arbitrary input/output signal terminal structure is connected. It does not means that a DRAM LSI 11 having an arbitrary input/output terminal structure and a DRAM LSI 12 with arithmetic logic processing capability having an arbitrary input/output terminal structure can be connected to the same memory bus.

In this manner, the main memory system 1 with arithmetic logic processing capability of the present invention shown in FIGS. 5 or 6 has a feature that the number of DRAM LSIs 12 with arithmetic logic processing capability can be arbitrarily selected. If there is no DRAM LSI 12 with arithmetic logic processing capability, the main memory system 1 has the same structure as that of the first or second example of the main memory system 9 of the conventional technique.

FIG. 8 is a block diagram illustrating the structure of the DRAM LSI 12 with arithmetic logic processing section according to the first embodiment of the present invention. The DRAM LSI 12 is composed of the memory bus 16, an internal bus 50, the memory section 13 connected between the memory bus 16 and the internal bus 50, and the arithmetic logic processing section 14. The arithmetic logic processing section 14 is composed of an interface circuit 62 connected to the memory bus 16, and a processing section 64 for arithmetic logic processing. The interface circuit 62 is composed of a plurality of pairs of registers. Addresses A1 and A1, and A3 and A4 are assigned to the registers in this example. The processing section 64 may be constructed only of a hardware circuit. In this example, the processing section 64 is composed of a ROM 66 for storing predetermined micro programs and an arithmetic logic processing unit 68. When an instruction is issued to one (A1) of the registers of the interface circuit 62, the arithmetic logic processing unit 68 executes a designated one of the micro programs to read out data from the memory section via the internal bus 50, to perform processing to the read data based on the designated micro program, and to store the processing result in the memory section 13. Also, the unit 68 stores data associated with the storage location of the processing result in the other register (A2).

Figure 9:
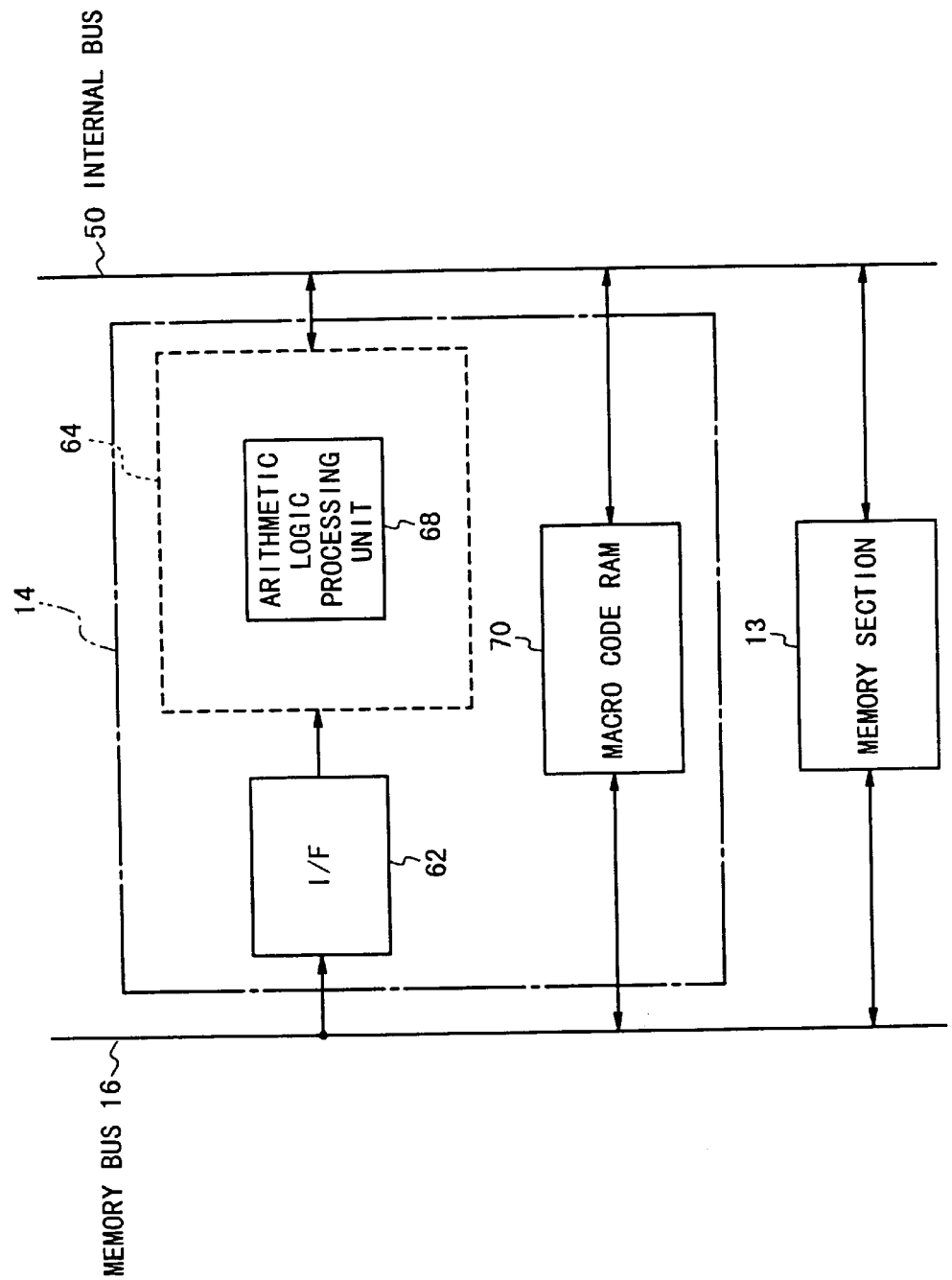
FIG. 9 is a block diagram illustrating the structure of a memory LSI with arithmetic logic processing capability according to a second embodiment of the present invention.

FIG. 9 is a block diagram illustrating the structure of the DRAM LSI 12 with arithmetic logic processing section according to the second embodiment of the present invention. The DRAM LSI 12 is composed of the memory bus 16, an internal bus 50, the memory section 13 connected between the memory bus 16 and the internal bus 50, and the arithmetic logic processing section 14. The arithmetic logic processing section 14 is composed of an interface circuit 62 connected to the memory bus 16, a macro code RAM 70 connected between the memory bus 16 and the internal bus 50, and a processing section 64 connected between the interface circuit 62 and the internal bus 50. The interface circuit 62 is composed of a plurality of pairs of registers. Addresses A1 and A2, and A3 and A4 are assigned to the registers in this example. The processing section 64 may be constructed only of a hardware circuit. In this example, the processing section 64 is composed of an arithmetic logic processing unit 68. Macro codes are transferred from the processor 31 and stored in the macro code RAM 70. When an instruction is issued to one (A1) of the registers of the interface circuit 62, the arithmetic logic processing unit 68 executes a designated one of the macro codes to read out data from the memory section via the internal bus 50, to perform processing to the read data based on the designated micro program, and to store the processing result in the memory section 13. Also, the unit 68 stores data associated with the storage location of the processing result in the other register (A2).

In a method of controlling the main memory system 1 with arithmetic logic processing capability of the present invention, an arithmetic logic processing start request is issued from the processor 31 to the main memory system 1 such that arithmetic logic processing is started in the main memory system 1. Then, an arithmetic logic processing result request is issued from the processor 31 to the main memory system 1, and the arithmetic logic processing result reply is sent from the main memory system 1 to the processor 31.

Figure 11:
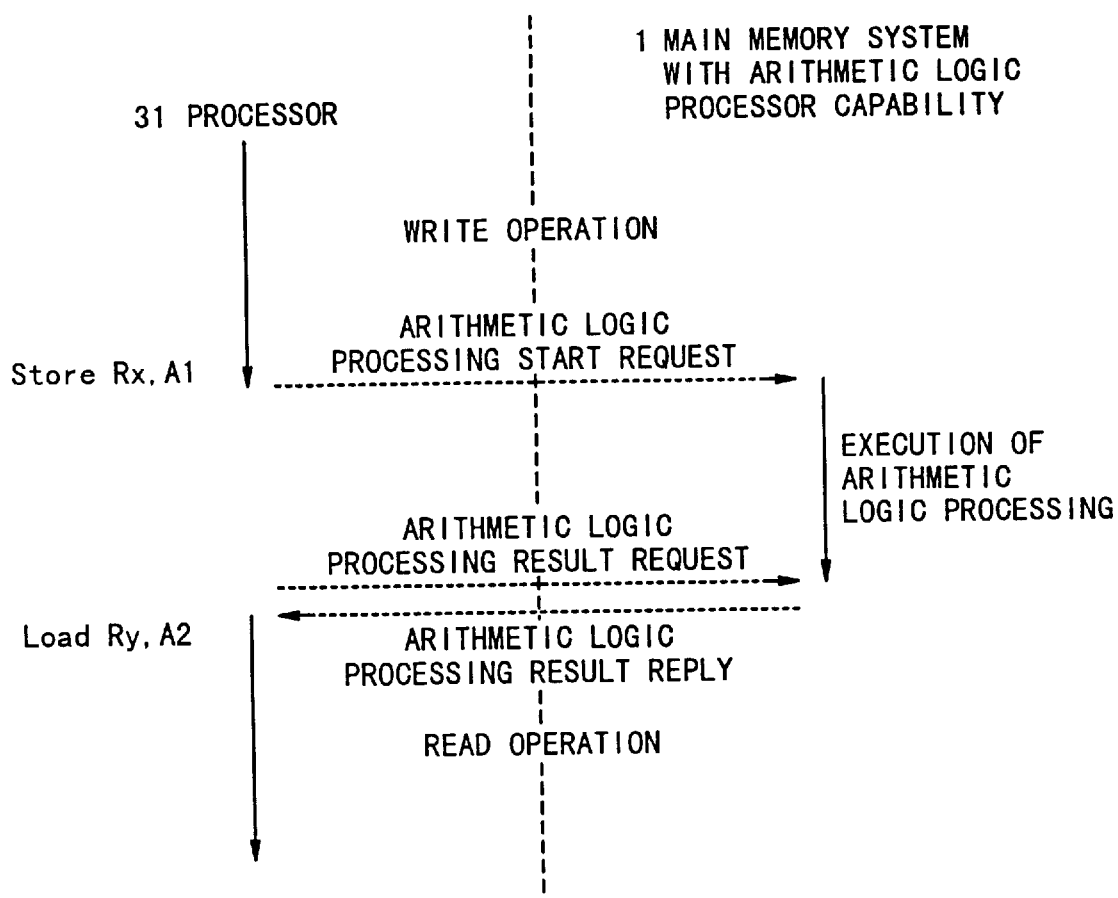
FIG. 11 is a diagram illustrating a method of controlling the main memory system with arithmetic logic processing capability according to the first embodiment of the present invention shown in FIG. 5.

FIG. 11 is a diagram illustrating the method of controlling of the main memory system 1 according to the first embodiment of the present invention in the processor system 3, in order to make arithmetic logic processing in the main memory system 1 with arithmetic logic processing capability possible. In the embodiment shown in FIG. 11, when a store instruction and a load instruction are executed by the processor 31, the arithmetic logic processing start request and the arithmetic logic processing result request are issued from the processor 31 to the main memory system 1 with arithmetic logic processing capability, respectively In FIG. 11, the processor 31 first issues a store instruction to a specific main memory address Al, i.e., a register address Al of the interface circuit 62 of one of the DRAM LSIs 12, after performing some processing. At this time, write data which should be stored is given as the content of a register Rx. The write data includes a start address of data to be processed by the arithmetic logic processing section 13 and stored in the memory section 13, data for designating one of the macro codes stored in the macro code RAM 70, if it is available, and an input parameter such as arguments.

The main memory system 1 interprets the store instruction (write operation) to this specific main memory address Al as an arithmetic logic processing start request. The content of the arithmetic logic processing start request is obtained by interpreting the write data on the side of the main memory system 1.

The arithmetic logic processing unit 14 executes the micro-program stored in the ROM 66 or one macro code designated by the write data to perform a processing to the data designated by the write data. Then, the unit 14 stores the processing result in the memory section 13 at an area determined in accordance with the micro-program or the macro code.

Next, the processor 31 issues a load instruction to a specific main memory address A2 which is the address of the other register paired with the register A1. The main memory system 1 interprets a load instruction (read operation) to this specific main memory address as an arithmetic logic processing result request. In response to the arithmetic logic processing result request, the main memory system 1 sends a concerned arithmetic logic processing result reply to the processor 31 as a read data. The processor 31 stores the sent read data in a register Ry. The arithmetic logic processing result reply is, for example, a storage address of the processing result in the memory section 13.

In this manner, in the method of controlling in the first embodiment of the present invention, read/write operations to the specific addresses by the issuance of the load/store instructions to the specific addresses of the main memory system 1 are interpreted as the arithmetic logic processing start request and the arithmetic logic processing result request, and the arithmetic logic processing result reply is executed.

These read/write operations are performed completely in the same way as being usual read/write operations performed to the DRAM LSI 11. In accordance with, a kind of read/write operation is transferred on the memory bus 16 shown in FIG. 5, using the control signal line 16-1. Also, an address for the read/write operation is transferred using the address signal line 16-2. Further, a request content of arithmetic logic processing start request and an arithmetic logic processing result reply are transferred using the bi-directional data signal line 16-3.

On the memory bus 16 shown in FIG. 6, the address for the read/write operation is transferred using the bi-directional data/address signal line 16-4. The content of an arithmetic logic processing start request and the content of the arithmetic logic processing result reply are also transferred using the bi-directional data/address signal line 16-4.

Figure 7A:
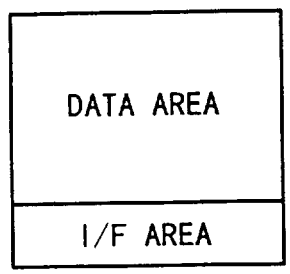
FIG. 7A is a diagram illustrating a first example of an address space for a memory LSI with arithmetic logic processing capability used in the main memory system shown in FIG. 4.
Figure 7B:
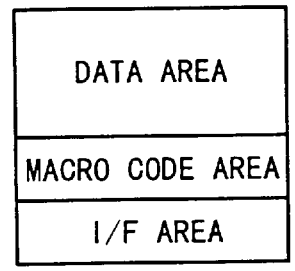
FIG. 7B is a diagram illustrating a second example of an address space of a memory LSI with arithmetic logic processing capability used in the main memory system shown in FIG. 4.
Figure 7C:
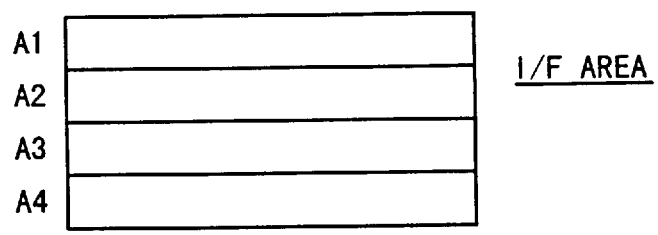
FIG. 7C is a diagram illustrating the structure of an interface (I/F) circuit.

FIGS. 7A and 7B show two cases of the memory mapping of the DRAM LSI 12 with arithmetic logic processing capability. FIG. 7A is a diagram illustrating the memory space of the memory LSI 12 with arithmetic logic processing capability in the first embodiment shown in FIG. 8. FIG. 7B is a diagram illustrating the memory space of the memory LSI 12 with arithmetic logic processing capability in the second embodiment shown in FIG. 9. FIG. 7C is a diagram illustrating an address space of the interface (I/F) circuit 62 of the memory LSI 12 with arithmetic logic processing capability in the first and second embodiments shown in FIGS. 8 and 9. The interface circuit 62 includes two pairs of registers in this example. The registers of addresses A1 and A2 are paired and the registers of addresses A3 and A4 are paired. The registers Al and A3 are used for the arithmetic logic processing start request and the registers A2 and A4 are used for the arithmetic logic processing result reply.

That is, in FIG. 7A, the internal main memory space of the DRAM LSI 12 with arithmetic logic processing capability is divided into a data area and an interface (I/F) area. The DRAM LSI 12 with arithmetic logic processing capability interprets a write operation to the I/F area, i.e., the address Al as the arithmetic logic processing start request and interprets a read operation to the address A2 as the arithmetic logic processing result request. Data such as input data as object of arithmetic logic processing, intermediate data of the arithmetic logic processing, and resultant data of the arithmetic logic processing are stored in the data area.

In FIG. 7B, further, a macro code area is provided. A partial program illustrating the procedure of the arithmetic logic processing which is performed in the DRAM LSI 12 with arithmetic logic processing capability is stored in this area. This partial program is called a macro code which is written in this area by the processor 31. A plurality of macro codes can be stored in the macro code area. In this example, tow macro codes can be stored in correspondence with two pairs of registers of the interface area.

Which of the mapping method shown in FIG. 7A and the mapping method shown in FIG. 7B is used depends on a more concrete method of requiring arithmetic logic processing based on the method of controlling the main memory system 1 which has been described in conjunction with FIG. 11. When a concrete processing content is sent as the request content in case of the arithmetic logic processing start request from the processor 31, the memory mapping method of FIG. 7A is suitable. In this case, in order to require the arithmetic logic processing which is composed of a plurality of processes, it is necessary that an arithmetic logic processing request is issued from the processor 31 for every process.

On the other hand, as shown in FIG. 7B, when a macro code is stored in the DRAM LSI 12 with arithmetic logic processing capability, the arithmetic logic processing request which contains an head address of a macro code is sufficient to be issued when a series of arithmetic logic processing is required from the processor 31 to the main memory system 1 with arithmetic logic processing capability.

Figure 1:
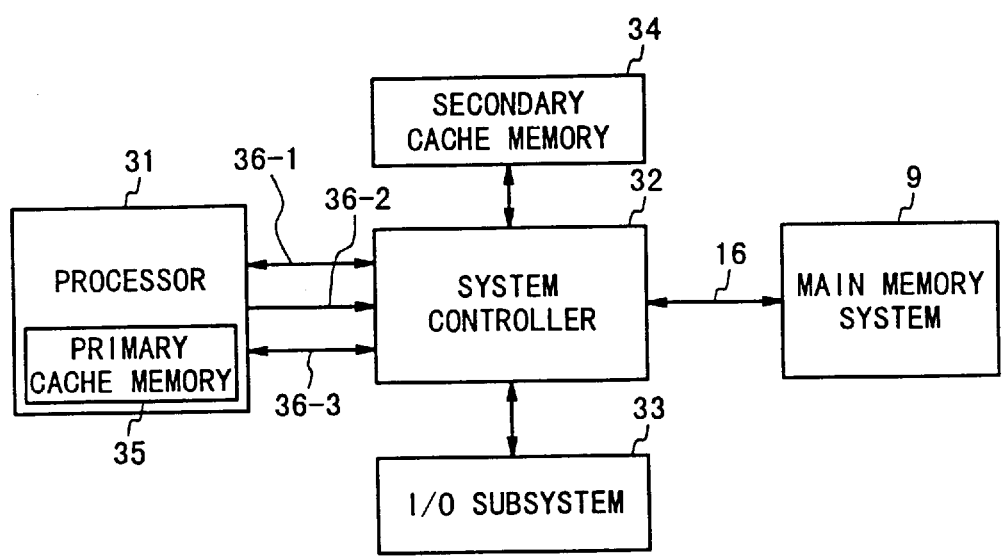
FIG. 1 is a block diagram illustrating the structure of a conventional example of a processor system using a main memory system.
Figure 10:
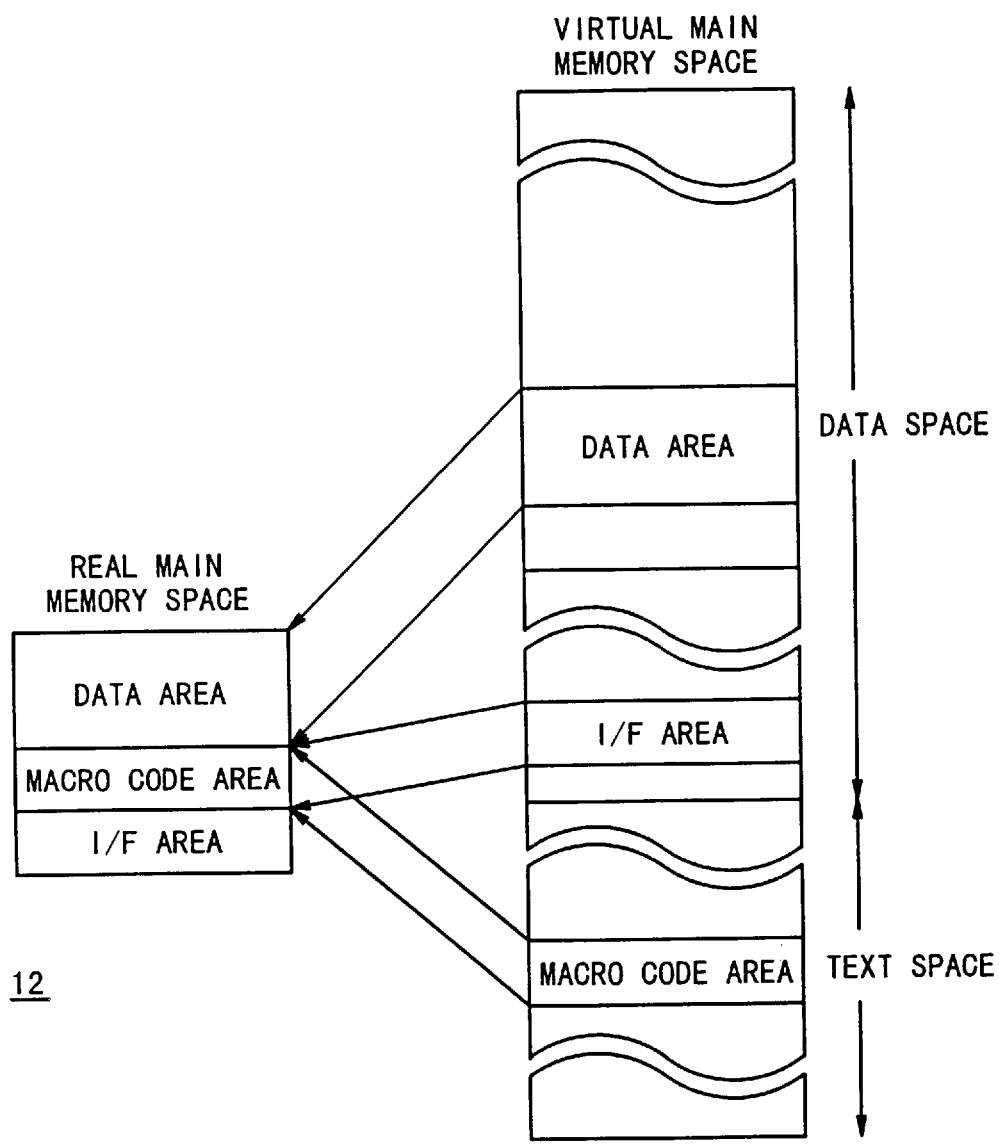
FIG. 10 is a diagram illustrating a relation of a virtual address space of the main memory system with arithmetic logic processing capability and a real address space of the memory LSI with arithmetic logic processing capability according to the second embodiment of the present invention.

FIG. 10 is a diagram of relation of a virtual main memory space mapping of the main memory system 1 with arithmetic logic processing capability and a real memory space of the DRAM LSI 12 with arithmetic logic processing capability. In FIG. 10, the real memory space corresponding to one DRAM LSI 12 with arithmetic logic processing capability is divided into the data area, the macro code area, the I/F area, similar to FIG. 7B. On the other hand, the virtual main memory space of FIG. 10 is divided into two of the data space and the text space, like the case of the conventional main memory system 9 shown in FIG. 1. The data area and I/F area of the DRAM LSI 12 with arithmetic logic processing capability is mapped from the data space of the virtual main memory space, and the macro code area is mapped from the text space of the virtual main memory space. In this case, the text space is the space in which a program is stored. The data space is the space in which ones except the program are stored, and it contains the data area and the I/F area.

With the method of controlling the main memory system with arithmetic logic processing capability according to the embodiments of the present invention which have been described by referring to FIGS. 7, 10 and 11, the following attention should be paid. The mapping from the virtual main memory space to the real main memory space is realized as described with reference to FIG. 10. In this case, for this purpose, a library function known in the name of, for example, a memory mapping function is used. As a result, the respective areas are correctly mapped to the real main memory space, which corresponds to the concerned DRAM LSI 12 with arithmetic logic processing capability, on an operating system. Also, in this case, it is necessary to designate the I/F area and the macro code area as un-cacheable areas such that the I/F area and the macro code area are not cached in the primary or secondary cache memories 35 and 34.

Here, "caching" means that the memory content of these areas are copied to the primary cache memory 35 which is installed in the processor 31 or the secondary cache memory 34. The un-cacheable designation means designation that such a copy operation is not performed to the areas. The reason why such a designation is needed is that there is possibility that the difference between the memory contents is generated when the copy exists at the primary cache memory 35 or the secondary cache memory 34, because both of the processor 31 and the DRAM LSI 12 with arithmetic logic processing capability access these areas.

Figure 12:
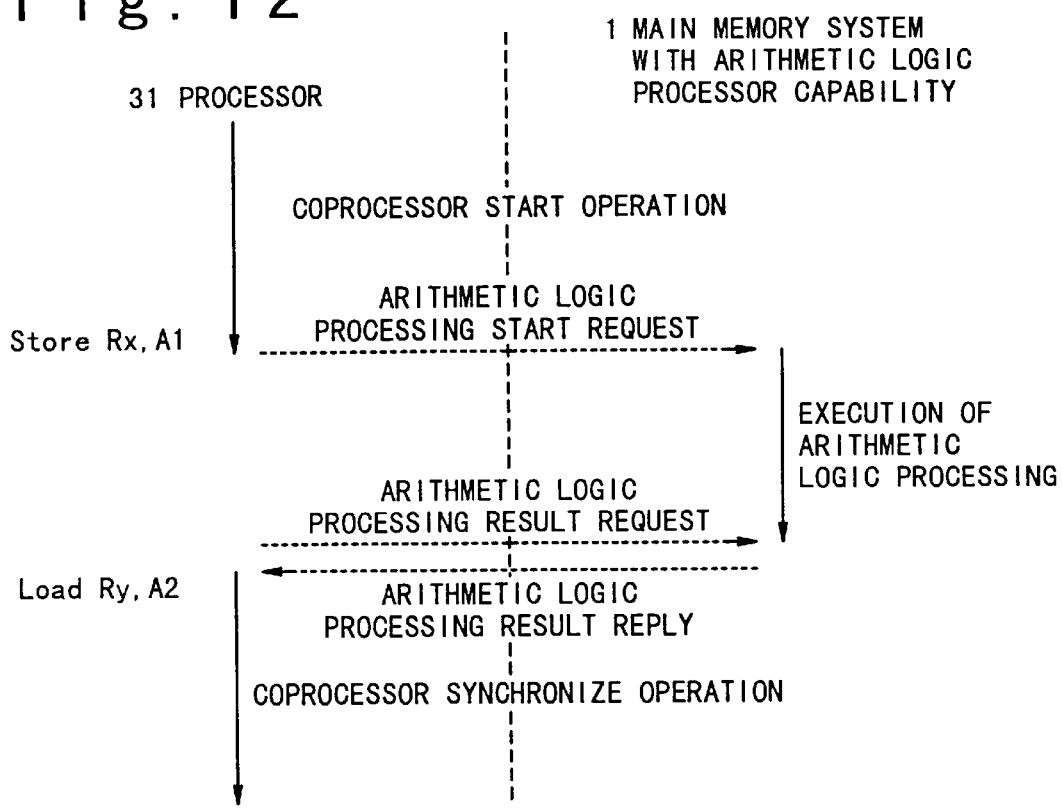
FIG. 12 is a diagram illustrating a method of controlling the main memory system with arithmetic logic processing capability according to the first embodiment of the present invention shown in FIG. 6.

FIG. 12 is a diagram illustrating a method of controlling according to the second embodiment of the present invention to allow the arithmetic logic processing in the main memory system 1 with arithmetic logic processing capability in the processor system 3 of the present invention. In this embodiment, an operation for an arithmetic logic processing start request and an operation of an arithmetic logic processing result request are performed in processor 31 using not the load/store instruction to the main memory space but coprocessor control instructions. In the result request, the arithmetic logic processing result reply is sent. In this case, the coprocessor control instructions mean both of a coprocessor start instruction and a coprocessor synchronize instruction to be described below.

In FIG. 12, the coprocessor start instruction is shown by an instruction code, Act Cp. The coprocessor start operation, i.e., an arithmetic logic processing start request is performed in response to this instruction. An argument N in the coprocessor start instruction means to start coprocessor N, and argument Rx designates the register which holds request contents. Also, the coprocessor synchronize instruction is shown by the instruction code, Sync Cp. A coprocessor synchronize operation, i.e., the arithmetic logic processing result request and the arithmetic logic processing result reply are performed in response to this instruction. The argument N of the coprocessor synchronous instruction means to start the coprocessor N, and the argument Ry designates the register which receives an arithmetic logic processing result.

These coprocessor start operation and coprocessor synchronize operation are transferred to the DRAM LSI 12 with arithmetic logic processing capability in the main memory system 1 with arithmetic logic processing capability through the memory bus 16. In accordance with, on the memory bus 16 shown in FIG. 5, a kind of operation on the coprocessor start or synchronization is transferred using the control signal line 16-1. Also, the number of the coprocessor is transferred using the address signal line 16-2 (each of the DRAM LSIs 12 with arithmetic logic processing capability is previously allocated with a number). Further, a request content in case of the arithmetic logic processing start request and an arithmetic logic processing result reply are transferred using the bi-directional data signal line 16-3, respectively.

Also, on the memory bus 16 of FIG. 6, the number of the coprocessor is transferred using the bi-directional data/address signal line 16-4, and a request content in case of arithmetic logic processing start request and an arithmetic logic processing result reply are transferred, respectively. Note that there is a case that the coprocessor number has the 1 to 1 correspondence to each of the DRAM LSIs 12 with arithmetic logic processing capability, and there is a case that a plurality of coprocessor numbers are allocated for each of the DRAM LSIs 12.

As an example of the processor which has such coprocessor control instructions, there is a scalar processor of a vector-type computer system. Also, it is possible to use an access instruction to the I/O space in a general microprocessor as the coprocessor control instruction. Further, in this embodiment, when the DRAM LSI 11 is used such as a fast page mode DRAM, EDO DRAM, and synchronous DRAM in the embodiment shown in FIG. 5, it is necessary to increase the number of control signal input terminals of the DRAM LSI 12 with arithmetic logic processing capability, compared to the number of control signal input terminals of the DRAM LSI 11. In this case, not only a read/write operation but also the coprocessor control operation can be transferred on the control signal line 16-1.

On the other hand, when a Rambus DRAM is used as the DRAM LSI 11 in the embodiment shown in FIG. 6, the Rambus DRAM adopts the technique in which an operation mode is represented by a time series protocol of the packet which is transferred onto the finite control signal input terminals. Therefore, it is possible to make the DRAM LSI 12 with arithmetic logic processing capability correspond to the control operation in response to the coprocessor instruction which has been described with respect to FIG. 12 only by changing a protocol without increasing the number of control signal input terminals.

Figure 13:
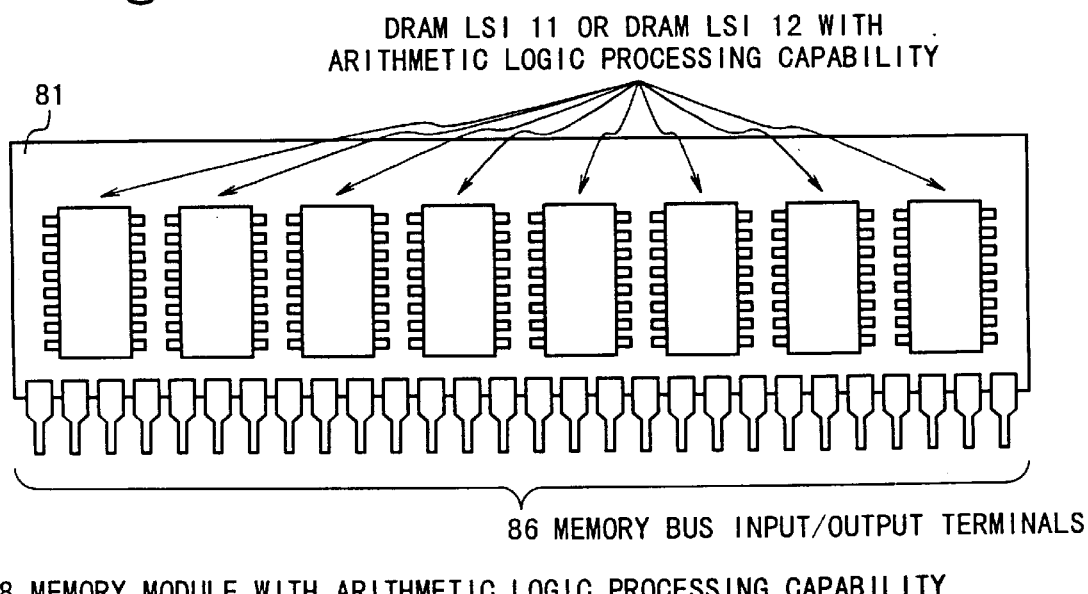
FIG. 13 is a diagram illustrating the arrangement of a memory module with arithmetic logic processing capability.

FIG. 13 is a diagram illustrating the structure of the memory module with arithmetic logic processing capability according to an embodiment of the present invention. The memory module 8 with arithmetic logic processing capability shown in FIG. 13 is composed of a plurality of DRAM LSIs 11 and a plurality of DRAM LSIs 12 with arithmetic logic processing capability. These are installed on a printed circuit board 81. The external terminals are memory bus input/output terminals 86. When the memory module 8 with arithmetic logic processing capability is used for the main memory system with arithmetic logic processing capability, it is connected to the memory bus 16. It is possible to arbitrarily set the ratio of the number of DRAM LSIs 11 and the number of DRAM LSIs 12 with arithmetic logic processing capability. The memory module 8 with arithmetic logic processing capability of FIG. 13 is one which corresponds to the memory module called a Single Inlined Memory Module (SIMM), or a Dual Inlined Memory Module (DIMM), which is mainly used for the main memory for a personal computer and so on, when the memory module 8 contains no DRAM LSI 12 with arithmetic logic processing capability.

Figure 14:
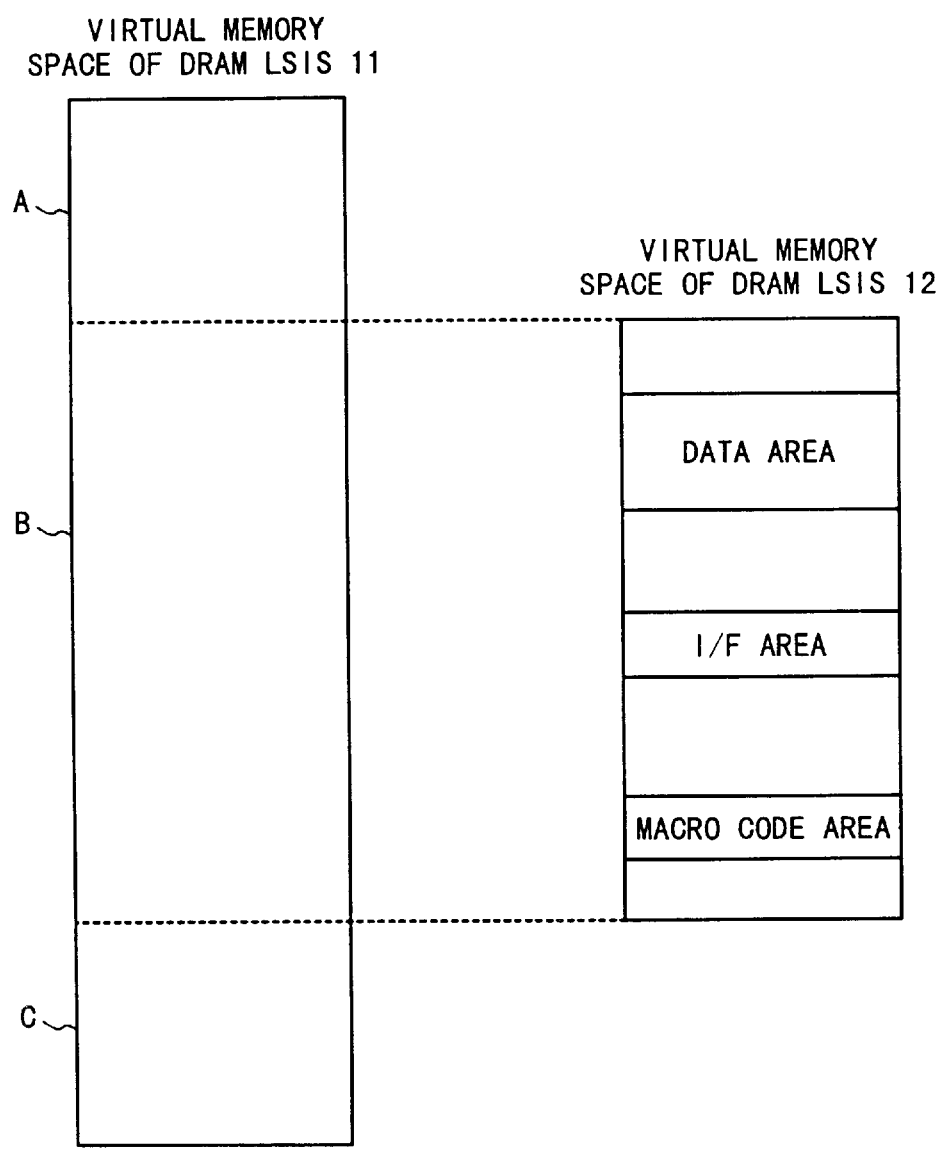
FIG. 14 is a diagram illustrating switching between an address map of memory LSIs with arithmetic logic processing capability and an address map of memory LSIs.

FIG. 14 is a memory space of DRAM LSIs 11 and a memory space of DRAM LSIs 12 with arithmetic logic processing capability when the memory module 8 with arithmetic logic processing capability is used. In this example, which of the memory space of the DRAM LSIs 11 and the memory space of the DRAM LSIs 12 is used as an area B can be designated on the operating system. When the memory space of the DRAM LSIs 11 is selected, the DRAM LSIs 12 are not used, i.e., the arithmetic logic processing is not executed. In this case, a processor system shown in FIG. 4 can be used as a usual or conventional processor system which can execute existing programs. When the memory space of the DRAM LSIs 12 is selected, the DRAM LSIs 12 are used, i.e., the arithmetic logic processing can be executed. In this case, a processor system shown in FIG. 4 can be used as a new processor system which can execute high performance programs.

The first effect of the present invention is in that the data band width which is needed on the memory bus of the processor system can be reduced, by performing arithmetic logic processing in the main memory system with arithmetic logic processing capability. This is because the data which was transferred from the main memory system to the processor on the memory bus in the conventional processor system is processed in the main memory system with arithmetic logic processing capability, more specifically, in the memory LSI with arithmetic logic processing capability.

For example, consider subtraction processing between two image blocks each of which has 8 pixels in the lateral direction and 8 pixels in the vertical direction. It is assumed that 1 pixel is 1 byte and a time required for the subtraction is S seconds. When the subtraction processing is performed on the processor, the data band width on the memory bus is 192 bytes/S per second in total. This is because the two image blocks each having 64 pixels are read on the side of the processor, and a subtraction result image block of 64 pixels is written in the side of the main memory system. In other words, 64×2+64=192. The portion "×2" indicates the read of the two subtracting images, and the portion "+" indicates the write of a computation result.

On the other hand, when the arithmetic logic processing is performed in the main memory system with arithmetic logic processing capability, it is sufficient that arithmetic logic processing start request is sent from the processor to the main memory with arithmetic logic processing capability, and it is detected based on the arithmetic logic processing result request whether or not the arithmetic logic processing is ended. Because it is possible for a n arithmetic logic processing start request, an arithmetic logic processing result request, an arithmetic logic processing result reply to be respectively realized with about 4 bytes, the data band width in this case is 12 B/S byte for every second. It is remarkably reduced to about 6% of the necessary data band width in case of the conventional technique.

The second effect of the present invention is in that the above first effect can be obtained by replacing the main memory system by the main memory system with arithmetic logic processing capability just as it is only, with no additional change or with slight change in the conventional processor system. The reason will be described below in two cases.

In the first case, there is adopted the method of controlling to perform the arithmetic logic processing of the main memory system with arithmetic logic processing capability using a read/write operation to the main memory space. In this case, the temporary microprocessor, the memory bus and so on in the conventional processor system can be used just as it is.

In the second case, there is adopted the method of controlling to perform the arithmetic logic processing of the main memory system with arithmetic logic processing capability using coprocessor control instructions. Even in this case, the arithmetic logic processing of the DRAM with arithmetic logic processing capability can be controlled, using the same memory bus just as it is, if the Rambus DRAM which was introduced as the conventional technique and so on are used as the memory LSI.

The third effect of the present invention is in that the improvement of the performance from the conventional processor system can be simply achieved, by replacing the conventional main memory system with the main memory system with arithmetic logic processing capability of the present invention in accordance with the second effect. Moreover, by using the memory module with arithmetic logic processing capability of the present invention as the main memory system with arithmetic logic processing capability, such an effect can be simply obtained only by replacing the memory module.

The fourth effect of the present invention is in that the improvement of the arithmetic logic processing performance can be achieved step-by-step by increasing the number of memory LSIs with arithmetic logic processing capability. This is because the number of arithmetic logic processing sections can be increased so that the performance improvement can be realized by operating these in parallel.

Note that the description of the embodiments of the present invention was performed, specifically taking DRAM LSI as the memory LSI. However, it is possible to construct the similar memory LSI with arithmetic logic processing capability and the main memory system with arithmetic logic processing capability by using the other memory LSI, e.g., an non-volatile ferroelectric memory LSI and so on.

What is claimed is:

1. A main memory with arithmetic logic processing capability, comprising:

a memory bus;

k first memories (k is an integer equal to or more than 0) connected to said memory bus, for storing data; and m second memories with arithmetic logic processing capability (m is an integer equal to or more than 1) connected to said memory bus, wherein each of said m second memories comprises:

a memory section for storing data, and an arithmetic logic processing section for performing a first processing to at least a part of said data stored in said memory section in response to a first instruction inputted via said memory bus, and for allowing a result of said first processing to be outputted onto said memory bus in response to a second instruction inputted via said memory bus.

2. A main memory according to claim 1, wherein said arithmetic logic processing section stores the first processing result in said memory section and allows a data designating the first processing result to be outputted onto said memory bus in response to said second instruction inputted via said memory bus.

3. A main memory according to claim 1, wherein each of said m second memories has a same terminal structure in an electrical and physical manner as each of said k first memories.

4. A main memory according to claim 1, wherein said first instruction is a write instruction to a specific one of said m second memories, and said second instruction is a read instruction to said specific second memory.

5. A main memory according to claim 1, wherein said first instruction is a coprocessor start operation to a specific one of said m second memories, and said second instruction is a coprocessor synchronize operation to said specific second memory.

6. A main memory according to claim 1, wherein said arithmetic logic processing section includes an interface circuit composed of at least a pair of registers, and an address space of said main memory is composed of a first address space for each of said k first memories, a second address space for said memory section of each of said m second memories, and a third address space for said interface section of said arithmetic logic processing section of each of said m second memories.

7. A main memory according to claim 6, wherein said first instruction is a write instruction to one of the registers of said pair, and said second instruction is a read instruction to the other of the registers of said pair.

8. A main memory according to claim 6, wherein the third address space is designated as an un-chacheable space on an operating system.

9. A main memory according to claim 1, wherein said arithmetic logic processing section includes an interface circuit composed of at least a pair of registers, and which of a part of a first address space for each of said k first memories, and an address space of a second address space for said memory section of each of said m second memories and a third address space for said interface section is to be used is selected on an operating system.

10. A main memory according to claim 1, wherein said main memory is installed on a print circuit board which can be installed in a processor system including another main memory board, in place of the other main memory board.

11. A main memory with arithmetic logic processing capability, comprising:

a memory bus;

k first memories (k is an integer equal to or more than 0) connected to said memory bus, for storing data; and m second memories with arithmetic logic processing capability (m is an integer equal to or more than 1) connected to said memory bus, wherein each of said m second memories comprises:

a memory section for storing data, a storing section for storing at least a macro code, and an arithmetic logic processing section for executing said at least a macro code in response to a first instruction inputted via said memory bus to perform a first processing to at least a part of said data stored in said memory section, and for allowing a result of said first processing to be outputted onto said memory bus in response to a second instruction inputted via said memory bus.

12. A main memory according to claim 11, wherein said arithmetic logic processing section stores the first processing result in said memory section and allows a data designating the first processing result in said memory section to be outputted onto said memory bus in response to said second instruction inputted via said memory bus.

13. A main memory according to claim 11, wherein said first instruction is a write instruction to a specific one of said m second memories, and said second instruction is a read instruction to said specific second memory.

14. A main memory according to claim 11, wherein said first instruction is a coprocessor start instruction to a specific one of said m second memories, and said second instruction is a coprocessor synchronize instruction to said specific second memory.

15. A main memory according to claim 11, wherein each of said m second memories has a same terminal structure in an electrical and physical manner as each of said k first memories.

16. A main memory according to claim 11, wherein said arithmetic logic processing section includes an interface circuit composed of at least a pair of registers, and an address space of said main memory is composed of a first address space for each of said k first memories, a second address space for said memory section of each of said m second memories, a third address space for said interface section of said arithmetic logic processing section of each of said m second memories, and a fourth address space for said storing section of each of said m second memories.

17. A main memory according to claim 16, wherein said first instruction is a write instruction to one of the registers of said pair, and said second instruction is a read instruction to the other of the registers of said pair.

18. A main memory according to claim 16, wherein the third address space and the fourth address space are designated as an un-chacheable space on an operating system.

19. A main memory according to claim 11, wherein said arithmetic logic processing section includes an interface circuit composed of at least a pair of registers, and which of a part of a first address space for each of said k first memories, and an address space of a second address space for said memory section of each of said m second memories, a third address space for said interface section, and a fourth address space for said storing section of each of said m second memories is to be used is selected on an operating system.

20. A main memory according to claim 11, wherein said main memory is installed on a print circuit board which is replaceable with another main memory board which is installed in a processor system using a socket.

21. A memory device with arithmetic logic processing capability, comprising:

a memory bus connected to external terminals;

an internal bus;

a dynamic random access memory (DRAM) section connected between said memory bus and said internal bus; and an arithmetic logic processing section connected between said memory bus and said internal bus, for performing a first processing to at least a part of data stored in said DRAM section in response to a first instruction inputted via said memory bus, and for allowing a result of said first processing to be outputted onto said memory bus in response to a second instruction inputted via said memory bus.

22. A memory de vice according to claim 21, further comprising a storing section for storing at least a macro code, and wherein said arithmetic logic processing section executes said at least a macro code in response to said first instruction inputted via said memory bus to perform said first processing to said at least a part of said data stored in said memory section.

23. A memory device according to claim 22, wherein said first instruction is a write instruction to said arithmetic logic processing section, and said second instruction is a read instruction to said arithmetic logic processing section.

24. A memory device according to claim 22, wherein said first instruction is a coprocessor start instruction to said arithmetic logic processing section, and said second instruction is a coprocessor synchronize instruction to said arithmetic logic processing section.

25. A memory device according to claim 22, wherein said memory device has an electrically and physically same terminal structure as another memory device such as said memory device is replaceable with the other memory device in a processor system.

26. A memory device according to claim 22, further comprising an interface circuit composed of at least a pair of registers, and interposed between said memory bus and said arithmetic logic processing section, and wherein said first instruction is a write instruction to one of the registers of said pair, and said second instruction is a read instruction to the other of the registers of said pair.

27. A memory device according to claim 21, wherein said first instruction is a write instruction to said arithmetic logic processing section, and said second instruction is a read instruction to said arithmetic logic processing section.

28. A memory device according to claim 21, wherein said first instruction is a coprocessor start instruction to said arithmetic logic processing section, and said second instruction is a coprocessor synchronize instruction to said arithmetic logic processing section.

29. A memory device according to claim 21, wherein said memory device has an electrically and physically same terminal structure as another memory device such as said memory device is replaceable with the other memory device in a processor system.

30. A memory device according to claim 21, further comprising an interface circuit composed of at least a pair of registers, and interposed between said memory bus and said arithmetic logic processing section, and wherein said first instruction is a write instruction to one of the registers of said pair, and said second instruction is a read instruction to the other of the registers of said pair.

31. A method of controlling a main memory with arithmetic logic processing capability in a processor system including a processor, said main memory comprising at least one memory device with arithmetic logic processing capability, comprising the steps of:

issuing a first instruction from said processor to said memory device via a memory bus;

performing a processing to at least a part of data stored in said memory section in said memory device in response to said first instruction;

storing a processing result in said memory device;

issuing a second instruction from said processor to said memory device via said memory bus; and outputting a data designating the processing result to said processor in response to said second instruction inputted via said memory bus.

32. A method according to claim 31, wherein said first instruction is a write instruction to said memory device, and said second instruction is a read instruction to said memory device.

33. A method according to claim 31, wherein said first instruction is a coprocessor start operation to said memory device, and said second instruction is a coprocessor synchronize operation to said memory device.

* * * * *